Oct. 6, 1970 E. F. SCHERER 3,533,017

AVALANCH DIODE OSCILLATOR WITH REDUCED NOISE

Filed Oct. 14, 1968 3 Sheets-Sheet 1

INVENTOR.
ERNST F. SCHERER
BY David M. Kay
AGENT.

AVALANCH DIODE OSCILLATOR WITH REDUCED NOISE

Filed Oct. 14, 1968 3 Sheets-Sheet 2

INVENTOR.
ERNST F. SCHERER

BY David M. Kay

AGENT.

INVENTOR.
ERNST F. SCHERER
BY David M. Kay
AGENT.

United States Patent Office 3,533,017
Patented Oct. 6, 1970

3,533,017
AVALANCHE DIODE OSCILLATOR WITH REDUCED NOISE

Ernst F. Scherer, Stoneham, Mass., assignor to Sylvania Electric Products, Inc., a corporation of Delaware Filed Oct. 14, 1968, Ser. No. 767,144
Int. Cl. H03b 7/14
U.S. Cl. 331—107 7 Claims

ABSTRACT OF THE DISCLOSURE

Avalanche diode oscillator having a DC biasing arrangement which includes a resistance element between the diode and a low-pass filter. The low-pass filter prevents RF energy from flowing in the biasing arrangement, and the resistance element attenuates low frequency noise energy which otherwise would flow in the biasing arrangement and be up-converted by the diode to cause noise sidebands in the output of the oscillator.

BACKGROUND OF THE INVENTION

This invention relates to microwave apparatus employing semiconductor diodes which generate energy at microwave frequencies. More particularly, it is concerned with avalanche diode oscillators and amplifiers having reduced noise.

In the past, it has been common practice to use vacuum tube klystrons to produce high frequency microwave energy for local oscillator applications. However, klystrons require large and expensive power supplies. Although various types of solid state harmonic generators such as varactor multipliers have recently been developed, they usually require many semiconductor devices and complicated circuitry.

More recently, devices which generate high frequency energy directly from a DC biasing voltage have been developed. One such device is the so-called avalanche diode which produces energy at microwave frequencies when the diode is operated in the reverse voltage breakdown region. Although avalanche diodes have been employed in oscillators and amplifiers, the noise figure of apparatus employing avalanche diodes has been significantly higher than that of functionally equivalent apparatus employing klystrons.

SUMMARY OF THE INVENTION

Signal conversion apparatus in accordance with the invention has improved noise characteristics. The apparatus employs a semiconductor diode for generating energy at microwave frequencies under the influence of a DC bias voltage. The diode is mounted in a microwave resonant structure which is resonant at an RF frequency generated by the semiconductor diode. A diode biasing means which includes a DC power source applies DC biasing voltage to the semiconductor diode while preventing RF energy from flowing to the DC power source and while suppressing low frequency energy circulating through the diode. The diode biasing means also includes a low-pass filter means for blocking the flow of RF energy from the semiconductor diode to the DC power source, and an impedance means which provides an impedance between the semiconductor diode and the low-pass filter means in order to reduce the circulation of unwanted low frequency noise currents generated by the semiconductor diode. It has been found that a high impedance between the diode and the low-pass filter means in the path of the DC biasing current reduces low frequency noise currents generated by the diode and flowing in the external DC biasing circuit. The result of these currents would be noise sidebands in the output of the apparatus due to up-conversion in the non-linear diode.

BRIEF DESCRIPTION OF THE DRAWINGS

Various objects, features, and advantages of signal conversion apparatus in accordance with the invention will be apparent from the following detailed discussion and the accompanying drawing wherein.

DETAILED DESCRIPTION OF THE INVENTION

Figure 1:
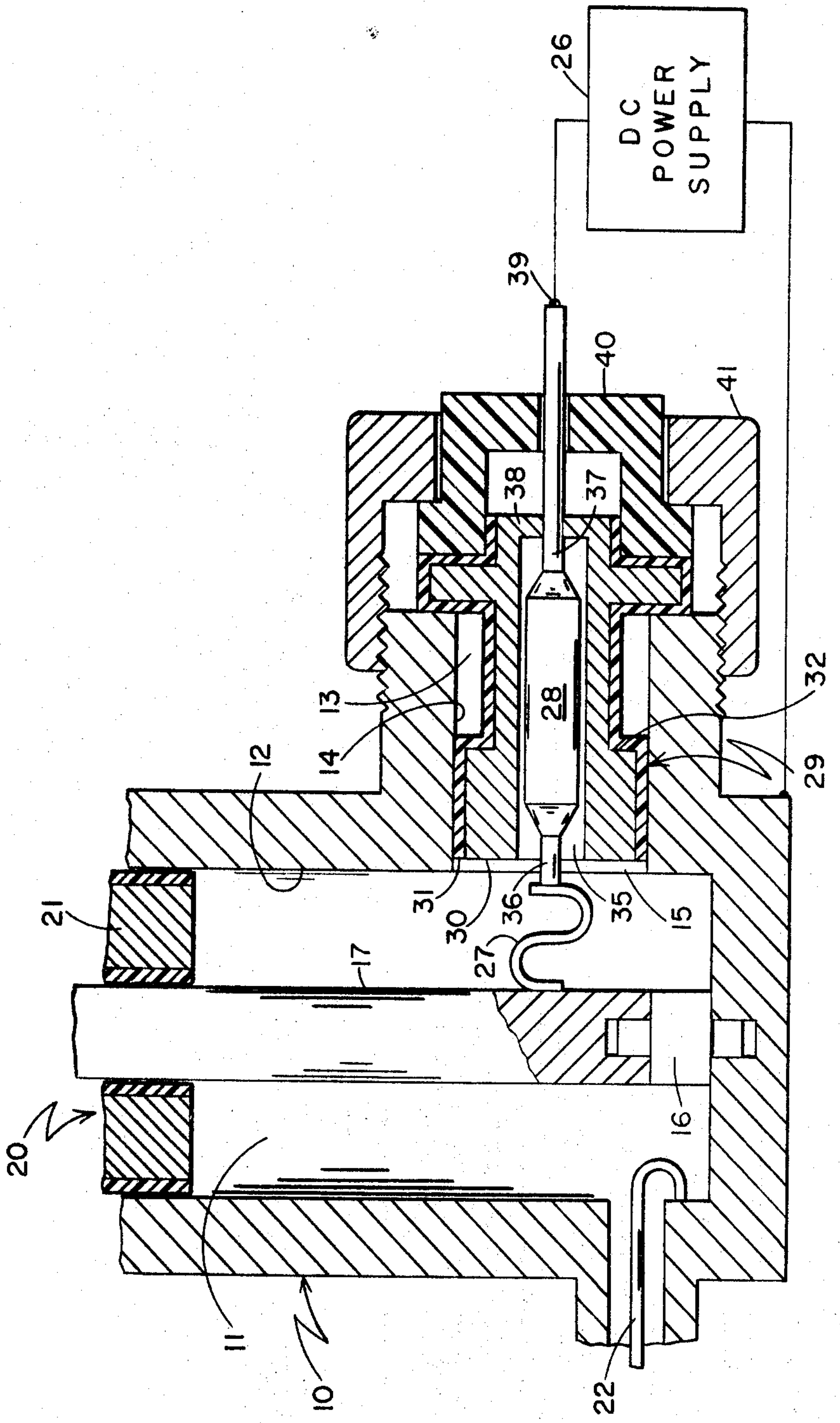
FIG. 1 is a representation partially in cross-section of an avalanche diode oscillator in accordance with the invention.

The avalanche diode oscillator in accordance with the invention as illustrated in FIG. 1 includes a body 10 of conductive material. A first cylindrical chamber 11 within the body 10 is defined by first walls 12 of the body and a second cylindrical chamber 13 is defined by second walls 14 of the body. The major axis of the second chamber is generally normal to the major axis of the first chamber and also to an opening 15 in the first walls through which the two chambers communicate.

A semiconductor diode 16 of the type which exhibits negative resistance under the influence of a DC bias voltage is mounted within the first chamber 11. Specifically, the diode is a P-N junction avalanche diode which generates microwave energy when operated in its reverse breakdown region. The first terminal of the diode is connected to a center conductor 17 lying along the major axis of the first chamber 11 and the second terminal is in contact with the body 10 at the end of the first chamber.

A coaxial microwave resonant structure 20 is provided by the first chamber 11 and its encircling walls together with the center conductor 17 and a tuning member 21 which may be moved (by means not shown) to adjust the resonant frequency of the structure. The tuning member 21 is of conductive material with an insulating coating, as shown, in order to provide a short circuit between the first walls 12 and the center conductor 17 for RF energy and an open circuit for DC energy. The microwave resonant structure is tuned to a desired RF frequency generated by the diode 16. An output probe 22 is suitably arranged to extract microwave energy from the resonant structure 20.

In accordance with the invention DC biasing voltage is applied to the diode by a biasing arrangement which includes a DC power supply 26 having one terminal grounded to the body 10. The other terminal of the DC power supply 26 is electrically connected to the first terminal of the diode 16 by means of a bias wire 27, a bias resistance 28, and a low-pass filter 29.

The low-pass filter 29 is disposed within the second chamber 13 in the body 10. The filter includes a conductive member 30 which extends along the major axis of the second chamber 13. The conductive member 30 is encircled by a coating of insulating material 31. The arrangement of the conductive member 30, insulating material 31, and the body 10 provides capacitance between the conductive member and the body. A perturbation 32 in the configuration of the conductive member provides inductance in the low-pass filter 29.

The bias resistance 28 is disposed within a passage 35 within the conductive member 30. The passage extends along the major axis of the second chamber 13 and opens into the first chamber 11. The bias resistance 28 also extends along the major axis of the second chamber with its first terminal lead 36 adjacent the opening 15 in the first walls 12 of the body and its second terminal lead 37 at the end portion 38 of the conductive member 30 remote from the opening 15. The end portion 38 of the conductive member 30 is directly connected to the second terminal lead 37 of the bias resistance 28 closing the passage 35. A DC connection 39 is provided between the second terminal lead 37 of the bias resistance 28 and the terminal of the DC power supply 26. The conductive member 30 and bias resistance 28 are held in position in the body 10 by an insulating washer 40 and a retaining cap 41.

The first terminal 36 of the bias resistance 28 is connected to the center conductor 17 within the first chamber 11 by the DC bias wire 27. The configuration of the bias wire 27 is such as to provide a choke to RF energy at the frequency to which the apparatus is tuned.

The apparatus of FIG. 1 operates in the known manner of avalanche diode oscillators to produce RF energy when the reverse breakdown voltage of the diode 16 is exceeded by the DC bias voltage applied across the diode terminals by means of the biasing arrangement. The resonant structure is tuned to the desired RF frequency so that energy at that frequency can be extracted from the apparatus by way of the output probe 22.

It has been found that in prior art apparatus a primary source of noise at the desired RF operating frequency is low frequency current fluctuations which are generated by the diode and then flow through portions of the diode biasing arrangement and across the diode junction where they are up-converted to highter frequencies. The biasing arrangement in accordance with the invention as illustrated in FIG. 1 serves to reduce the effect of the low frequency currents as a source for the up-converted or modulation noise while blocking the flow of RF energy from the semiconductor diode 16 to the DC power supply 26. Operation of the biasing arrangement may be more readily understood by reference to FIGS. 2 and 3 which are equivalent circuit diagrams of the biasing arrangement at high frequency and low frequency, respectively.

Figure 2:
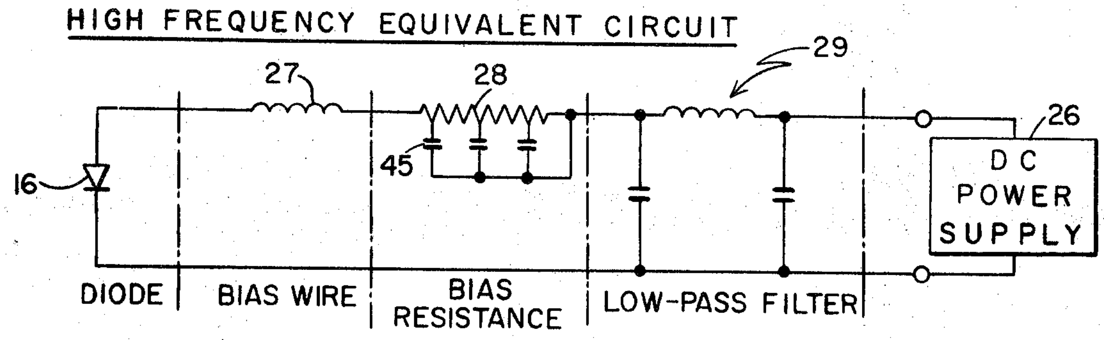
FIG. 2 is an equivalent circuit diagram of the biasing arrangement of the apparatus of FIG. 1 at high frequencies.

The diode biasing arrangement operates so as to prevent energy at microwave frequencies generated by the diode from flowing to the DC power supply 26. As indicated in FIG. 2 the bias wire 27 acts as an inductive impedance or choke to the flow of RF energy. Because of the tendency of the high frequency currents to flow on the outer surfaces of the bias resistance 28, its effect is not particularly significant. Since the outer surfaces of the bias resistance 28 are spaced close to the walls defining the passage 35 in the conductive member 30, distributed capacitance 45 between the resistance 28 and the conductive member 30 partially by-passes the resistance 28.

Since high frequency currents tend to flow along the surfaces of conductors, current flows from the second terminal leads 37 of the bias resistance 28 along the walls defining the passage 35 and then along the outer surface of the conductive member 30. The combination of the conductive member 30, the insulating material 31, and the body 10 provides a low-pass filter 29 as explained above. Thus, the elements in the DC biasing arrangement function to block the flow of RF energy from the semiconductor diode 16 toward the DC power supply 26.

Figure 3:
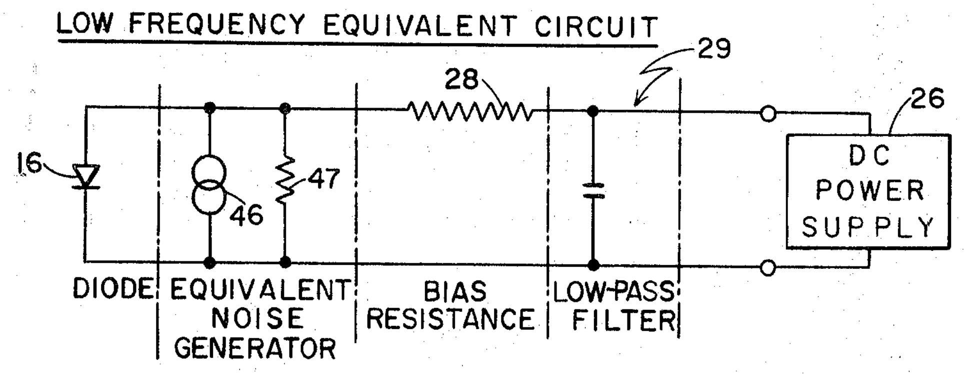
FIG. 3 is an equivalent circuit diagram of the biasing arrangement of the apparatus of FIG. 1 at low frequencies.

FIG. 3 is an equivalent circuit diagram of the diode biasing arrangement of the apparatus of FIG. 1 at low frequencies. At low frequencies the diode may be considered a noise generator 46 in parallel with the space charge resistance 47 of the diode junction. The path for the low frequency noise currents is through the bias wire 27, which provides no significant impedance, and then through the bias resistance 28. From the second terminal lead 37 of the bias resistance current flows directly to the conductive member 30 of the low-pass filter 29. At low frequencies the low-pass filter 29 acts as a capacitance.

Thus, the path of noise current flow is from the diode 16, through the bias resistance 28, across the capacitance of the low-pass filter 29, and back to the diode by way of the body 10. In this path the bias resistance 28 provides the only high impedance to the noise current. Without the bias resistance 28 interposed between the diode 16 and the low-pass filter 29 the noise currents would be unimpeded in their flow through the unavoidable path provided by the shunt capacitance of the low-pass filter 29 and across the diode junction where they are up-converted to high frequency noise. It has been found practical to employ a bias resistance 28 having a value of resistance approximately ten times the value of the space charge resistance 47 of the diode. This value provides reasonable suppression of the low frequency components which are up-converted to noise without introducing excessive DC energy loss.

A bias impedance other than a resistance may be employed so long as it provides sufficient impedance to the low frequency energy components and does not series resonate with other reactances in the apparatus. It is desirable that the impedance not act as an additional source of noise. Metal film type of resistors have particularly good low noise characteristics for use in the apparatus of the invention.

Figure 4:
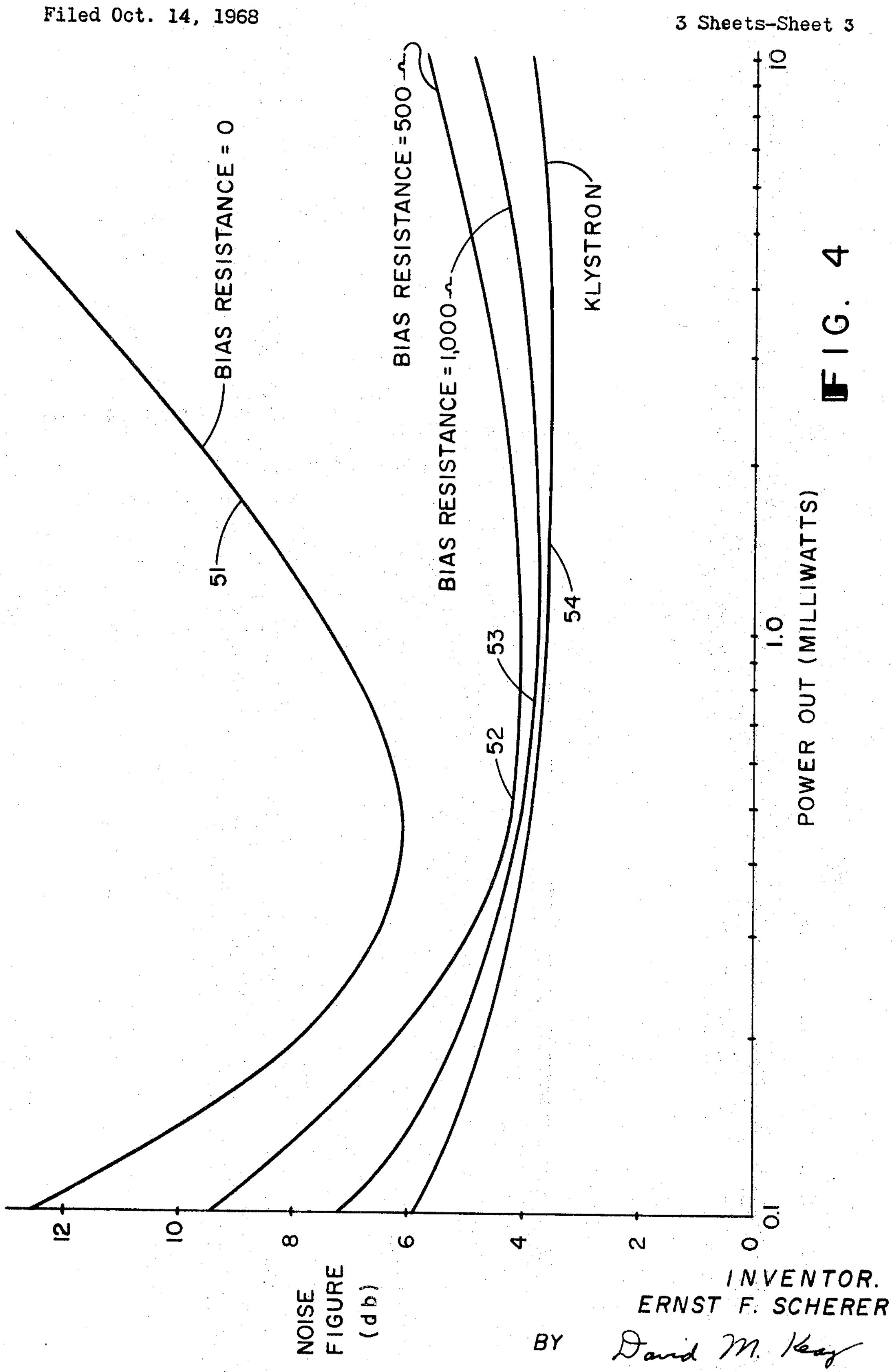
FIG. 4 is a graph illustrating the overall noise figures of a balanced mixer employing as a local oscillator the apparatus of FIG. 1, an avalanche diode oscillator not employing the invention, and a klystron.

The effect of the biasing arrangement of the apparatus of FIG. 1 is clearly apparent from the graph of FIG. 4. FIG. 4 includes curves showing the overall noise figures of a balanced X-band mixer versus output power of the local oscillator under various conditions. The local oscillator output frequency was 9400 mHz. and the IF frequency was 30 mHz. Curves 51, 52, and 53 show the operation of the mixer employing a Sylvania type SYA3200 avalanche diode oscillator having a biasing arrangement in accordance with the invention and bias resistances of 500, and 1,000 ohms, respectively. Curve 54 shows the operation of the mixer employing an X–13 type klystron as a local oscillator.

Curve 51 which is the operating curve of the mixer employing a bias resistance 28 of zero ohms is equivalent to prior art avalanche diode oscillators not practicing the present invention. Curves 52 and 53 illustrate results obtained by employing bias resistances of 500 and 1,000 ohms, respectively, in the apparatus according to the invention. Thus it can be seen that avalanche diode oscillators employing the invention provide greatly reduced noise in comparison with prior art apparatus. The overall noise level approaches that obtained with a klystron, curve 54.

While there has been shown and described what is considered a preferred embodiment of the present invention, it will be obvious to those skilled in the art that various changes and modifications may be made therein without departing from the invention as defined in the appended claims. For example, the oscillator of FIG. 1 may be modified to serve as an amplifier by the selection of appropriate operating parameters.

What is claimed is:

1. Signal conversion apparatus comprising:

a semiconductor diode for generating energy at microwave frequencies;

microwave resonant structure resonant at an RF frequency generated by the semiconductor diode; and diode biasing means for applying DC biasing voltage to the semiconductor diode including:

- a DC power source;
- low-pass filter means for blocking the flow of RF energy from the semiconductor diode to the DC power source; and
- impedance means providing impedance between the semiconductor diode and the low-pass filter means for reducing the circulation of unwanted low frequency noise currents generated by the semiconductor diode.

2. Signal conversion apparatus in accordance with claim 1 wherein:
said semiconductor diode has a first and a second terminal and exhibits negative resistance under the influence of a DC bias voltage applied across the terminals; and
said diode biasing means includes:
a first DC connection between the first terminal of the semiconductor diode and the impedance means; and
a second DC connection between the impedance means and the DC power source.

3. Signal conversion apparatus comprising:
a body of conductive material having first walls defining a first chamber and second walls defining a second chamber, said second chamber communicating with said first chamber through an opening in said first walls;
microwave resonant structure including said first chamber;
a semiconductor diode having a first and a second terminal and being operable to generate energy at microwave frequencies under the influence of a DC bias voltage applied across the terminals;
said semiconductor diode being mounted within said first chamber with said second terminal in contact with the body;
said microwave resonant structure being resonant at an RF frequency generated by the semiconductor diode;
a low-pass filter including:
a conductive member having a passage therein and mounted within said second chamber;
insulating material encircling said conductive member and intermediate said conductive member and the second walls of the body;
said body, insulating material, and conductive member providing capacitance between the conductive member and the body;
a resistance element having a first and a second terminal and mounted within the passage in the conductive member;
a DC power source;
a first DC connection coupling the first terminal of the semiconductor diode to the first terminal of the resistance element; and
a second DC connection coupling the second terminal of the resistance element to the DC power source;
said second terminal of the resistance element being connected to the conductive member.

4. Signal conversion apparatus in accordance with claim 3 wherein:

said conductive member has a first end portion located adjacent the opening in the first walls and a second end portion located remote from the opening;
the first terminal of the resistance element is located adjacent the opening and the second terminal of the resistance element is located adjacent the second end portion of the conductive member; and
said second terminal of the resistance element is in contact with the second end portion of the conductive member.

5. Signal conversion apparatus in accordance with claim 4 wherein:
said second chamber has a major axis lying generally normal to the opening in the first walls of the body;
said conductive member extends along the major axis of the second chamber with the first end portion adjacent the opening in the first walls and the second end portion remote from the opening;
said passage in the conductive member extends along the major axis of the second chamber and opens into the first chamber;
said resistance element within said passage extends along the major axis of the second chamber with the first terminal adjacent the opening and the second terminal remote from the opening; and
the second end portion of the conductive member contacts the second terminal of the resistance element and closes the passage in the conductive member.

6. Signal conversion apparatus in accordance with claim 5 wherein:
said first DC connection provides a choke to RF energy at the resonant frequency of the microwave resonant structure; and
said conductive member includes an inductive perturbation in its configuration.

7. Signal conversion apparatus in accordance with claim 6 wherein:
said semiconductor diode is an avalanche diode; and
the value of resistance of said resistance element is approximately ten times the value of resistance of the low frequency space charge resistance of the avalanche diode.

References Cited

UNITED STATES PATENTS 3,474,351 10/1969 Cook et al. ---------- 331—107

JOHN KOMINSKI, Primary Examiner

U.S. Cl. X.R.

331—101